US011025234B1

(12) United States Patent
Chakraborty et al.

(10) Patent No.: US 11,025,234 B1
(45) Date of Patent: Jun. 1, 2021

(54) PROCESS AND TEMPERATURE COMPENSATED RING OSCILLATOR

(71) Applicant: International Business Machines Corporation, Armonk, NY (US)

(72) Inventors: Sudipto Chakraborty, Plano, TX (US); Rajiv Joshi, Yorktown Heights, NY (US); Steven J. Holmes, Ossining, NY (US); Bruce B. Doris, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/799,305

(22) Filed: Feb. 24, 2020

(51) Int. Cl.
*H03K 3/03* (2006.01)
*H03L 7/099* (2006.01)
*H03B 5/04* (2006.01)

(52) U.S. Cl.
CPC ......... *H03K 3/0322* (2013.01); *H03L 7/0995* (2013.01); *H03B 5/04* (2013.01)

(58) Field of Classification Search
CPC .................................................. H03K 3/0322
USPC ......................................................... 331/57
See application file for complete search history.

(56) References Cited

U.S. PATENT DOCUMENTS

| 6,100,768 | A | * | 8/2000 | Hirayama | ............ | H03K 3/0315 |
| | | | | | | 331/57 |
| 6,157,180 | A | * | 12/2000 | Kuo | .................. | G05F 3/242 |
| | | | | | | 323/282 |
| 7,132,880 | B2 | | 11/2006 | Ingino, Jr. | | |
| 7,531,836 | B2 | | 5/2009 | Liu et al. | | |
| 7,948,330 | B2 | | 5/2011 | Seo et al. | | |
| 8,081,040 | B1 | * | 12/2011 | Avitan | .................. | H03L 7/0995 |
| | | | | | | 331/186 |
| 8,305,056 | B2 | | 11/2012 | Wadhwa | | |
| 8,710,930 | B2 | | 4/2014 | Tan et al. | | |
| 8,988,153 | B1 | | 3/2015 | Roy | | |
| 9,276,561 | B2 | | 3/2016 | Clark et al. | | |
| 9,319,031 | B2 | | 4/2016 | Green et al. | | |

(Continued)

FOREIGN PATENT DOCUMENTS

CN          106160738 A          11/2016

OTHER PUBLICATIONS

Kim, D., et al., "A Supply Noise Insensitive PLL with a Rail-to-Rail Swing Ring Oscillator and a Wideband Noise Suppression Loop", 2017 Symposium on VLSI Circuits, Date of Conference: Jun. 5-8, 2017, 2 pages, Conference Location: Kyoto, Japan.

*Primary Examiner* — Joseph Chang
(74) *Attorney, Agent, or Firm* — Scully, Scott, Murphy & Presser, P.C.; Daniel P. Morris

(57) ABSTRACT

Methods and systems for regulating supply voltage is described. In an example, a device can receive unregulated supply. The device can be connected to a ring oscillator and an integrated circuit. The device can be configured to regulate the unregulated supply to a first voltage. The device can be further configured to provide the regulated supply to the ring oscillator, where the ring oscillator operates with the regulated supply. The device can be further configured to, in response to a change in the regulated supply from the first voltage to a second voltage, adjust the changed regulated supply to return to the first voltage to cause the ring oscillator to operate with a constant regulated supply having the first voltage.

20 Claims, 7 Drawing Sheets

(56) References Cited

U.S. PATENT DOCUMENTS

| | | | |
|---|---|---|---|
| 9,870,012 B2 | 1/2018 | Raychowdhury et al. | |
| 10,110,239 B1 | 10/2018 | Shu et al. | |
| 2002/0000886 A1* | 1/2002 | Ichihara | H03B 5/04 |
| | | | 331/57 |

* cited by examiner

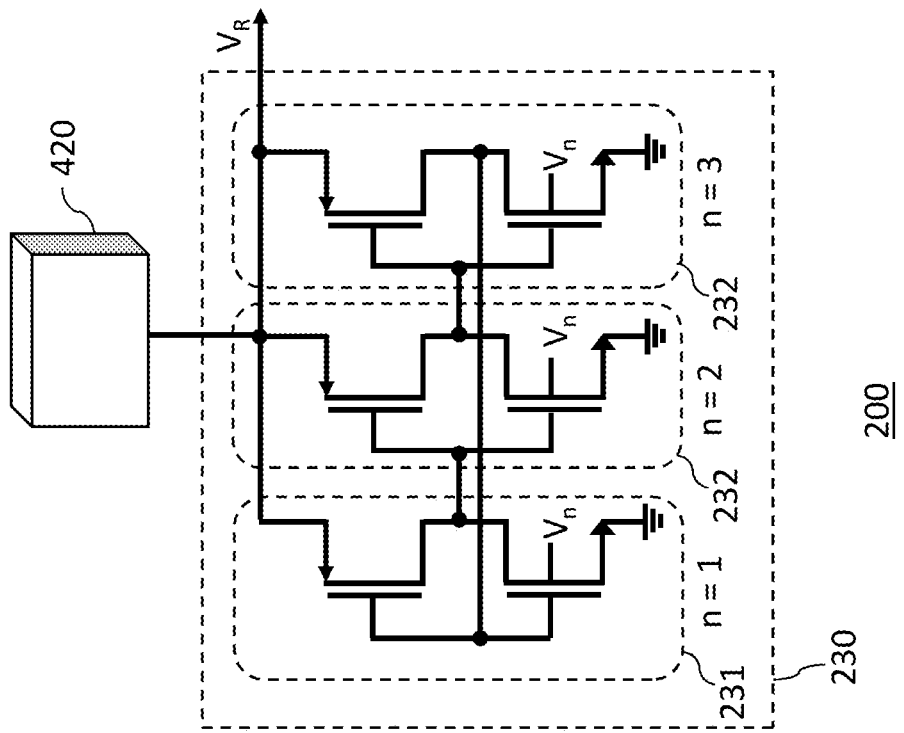
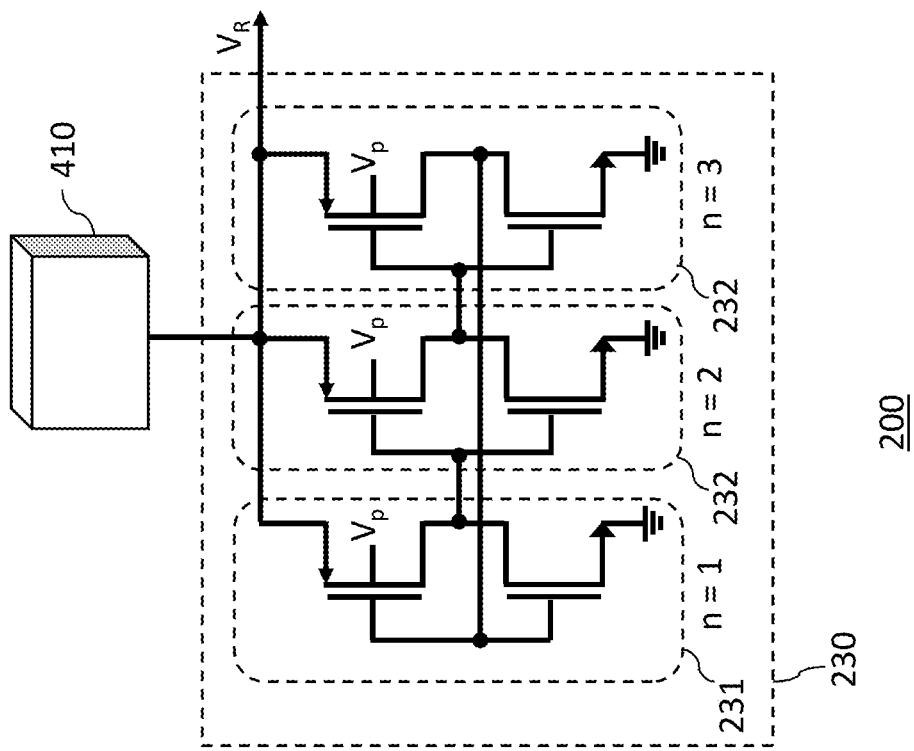
Fig. 4A
Fig. 4B

PROCESS AND TEMPERATURE COMPENSATED RING OSCILLATOR

BACKGROUND

The present disclosure relates in general to ring oscillators and regulators that can be implemented to provide power supply to circuits and devices.

A single ended ring oscillator is a device including an odd number of inverters connected in a loop, where an output of the ring oscillator oscillates between two voltage levels. The output of the last inverter is fed back into the first inverter to facilitate the oscillation between the two voltage levels. The oscillation frequency of the ring oscillator can be adjusted by changing a number of inverters to be included in the ring oscillator or changing the supply voltage being provided to the ring oscillator. A regulator can be coupled to the ring oscillator to regulate the voltage being outputted by the ring oscillator. In an example, the output of the ring oscillator can provide regulated voltage to operate a target device, where the regulated voltage can be provided at an operating frequency of the target device.

SUMMARY

In some examples, a system for regulating supply voltage is generally described. The system can include a ring oscillator configured to receive unregulated supply and a device connected to the ring oscillator. The device can be configured to regulate the unregulated supply to a first voltage. The device can be further configured to provide the regulated supply to the ring oscillator, where the ring oscillator operates with the regulated supply. The device can be further configured to, in response to a change in the regulated supply from the first voltage to a second voltage, adjust the changed regulated supply to return to the first voltage to cause the ring oscillator to operate with a constant regulated supply having the first voltage.

In some examples, a system for regulating supply voltage is generally described. The system can include a power supply configured to provide unregulated supply, a ring oscillator configured to receive the unregulated supply. The system can further include an integrated circuit having an operating frequency. The system can further include a device connected to the ring oscillator and the integrated circuit. The device can be configured to receive the unregulated supply. The device can be further configured to regulate the unregulated supply to a first voltage. The device can be further configured to provide the regulated supply to the ring oscillator, where the ring oscillator operates with the regulated supply. The device can be further configured to, in response to a change in the regulated supply from the first voltage to a second voltage, adjust the changed regulated supply to return to the first voltage to cause the ring oscillator to operate with a constant regulated supply having the first voltage.

In some examples, a method for regulating supply voltage is generally described. The method can include receiving unregulated supply. The method can further include regulating the unregulated supply to a first voltage. The method can further include providing the regulated supply to a ring oscillator that operates with the regulated supply. The method can further include determining an oscillation frequency of the ring oscillator. The method can further include, in response to the oscillation frequency indicating a change in the regulated supply from the first voltage to a second voltage, adjusting the changed regulated supply to return to the first voltage to cause the ring oscillator to operate with a constant regulated supply having the first voltage.

Further features as well as the structure and operation of various embodiments are described in detail below with reference to the accompanying drawings. In the drawings, like reference numbers indicate identical or functionally similar elements.

BRIEF DESCRIPTION OF THE DRAWINGS

FIG. 4A illustrates another example embodiment of the example system of FIG. 2 that can implement a process and temperature compensated ring oscillator in one embodiment of the present disclosure.

FIG. 4B illustrates another example embodiment of the example system of FIG. 2 that can implement a process and temperature compensated ring oscillator in one embodiment of the present disclosure.

DETAILED DESCRIPTION

Figure 1:
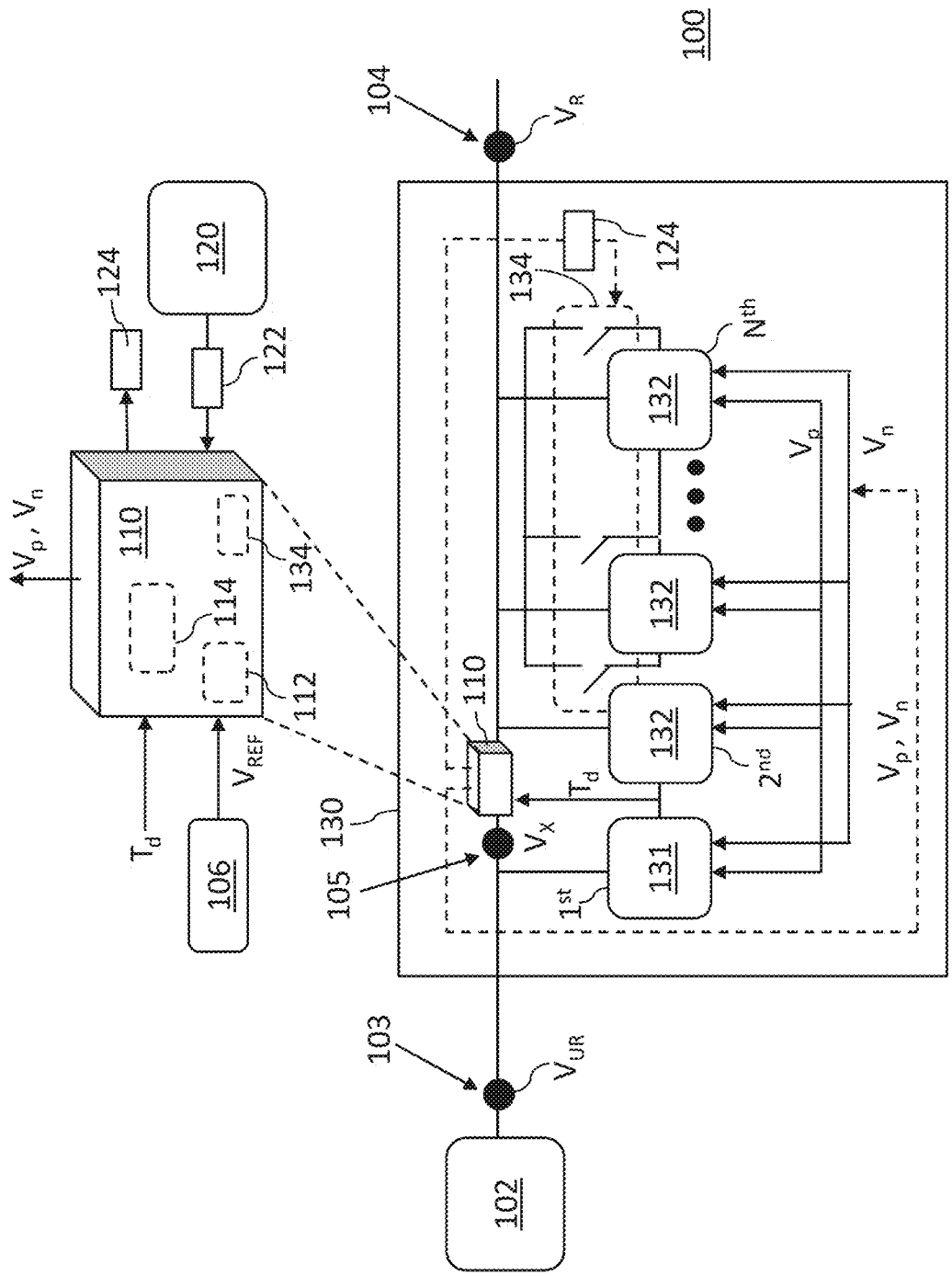
FIG. 1 is a diagram showing an example system that can implement a process and temperature compensated ring oscillator in one embodiment of the present disclosure.

In some examples, a ring oscillator can receive unregulated supply voltage and operate at a specific frequency. For example, a target device may be configured to operate at an operating frequency $F_{op}$, and the ring oscillator can adjust the unregulated supply voltage to output supply voltage at an oscillation frequency $F_{osc}$ that may match $F_{op}$. A voltage regulator can be coupled to the ring oscillator to regulate and control the output supply voltage that may be required to operate the target device. A single ended ring oscillator can include an odd number of inverters, a differential ring oscillator can include an even number of stages, where an inverter can include, for example, two transistors that may be subjected to process and temperature variations. For example, attributes, such as threshold voltage, of these transistors, can change due to manufacturing process variations and temperature changes in a testing or operating environment of the inverter. The changes to the threshold voltages of the transistors among the inverters can contribute to changes in the supply voltage being outputted by the ring oscillator.

In some examples, regulators such as a low-dropout (LDO) regulators, can be coupled to the ring oscillator to regulate the supply voltage needed for the ring oscillator. The LDO regulator can, for example, track changes to the threshold voltages of the inverters and regulate the supply voltage based on the tracked changes. Further, in some examples, the unregulated supply voltage can change (e.g., reduced) over time, causing the LDO regulator to regulate the output supply voltage based on changes to both the unregulated supply voltage and the inverters among the ring oscillator. These tracking and adjustment performed by the LDO regulator can consume a significant amount of power, and can lead to low power supply rejection ratio (PSRR).

PSRR can be an important aspect of a low dropout (LDO) regulator, which provides a ratio of the variation in the regulated supply voltage to the variation in the unregulated supply voltage. Ring oscillators can be very sensitive to the supply voltage, and a high PSRR regulator can reduce the change in output frequency and the jitter associated with the output clock waveform. It also leads to immunity to unwanted supply variations from the other blocks in the system.

The methods and systems being described herein can provide a regulator and regulation schemes to reduce power consumption caused by tracking changes and adjusting output supply voltage. In an example embodiment, a regulator device described herein can perform a plurality of adjustments to compensate the voltage changes caused by process and temperature variation experienced by the inverters of a ring oscillator. The adjustments can cause the ring oscillator to operate with constant voltages instead of varying voltages (e.g., varying voltages caused by process and temperature variations of the inverters). Further, the constant voltage being outputted by the regulator device can be fed back to the regulator device for further refinement to compensate process and temperature variations. The refinement using constant voltages can reduce power consumption incurred by the compensations when compared to using varying voltages. The constant voltage outputted by the regulator device described herein can also provide supply voltage at a stable frequency that matches the operating frequencies of a target device sharing the same power supply as the ring oscillator. In an example, activation of a number of inverter stages can be reconfigurable to perform a coarse adjustment in the center frequency, and fine adjustment in the center frequency can be performed by adjusting the supply voltage or the control voltage to a voltage variable capacitor.

FIG. 1 is a diagram showing an example system that can implement a process and temperature compensated ring oscillator in one embodiment of the present disclosure. The system 100 can include a power supply 102, a regulator device 110 (herein "device 110"), a computer device 120 (herein "device 120"), and/or a ring oscillator 130. The power supply 102 can be configured to provide power to components of the system 100, such as the device 110, the device 120, and the ring oscillator 130. The device 120 can be, for example, a computer, a processor, a controller, and/or other types of hardware device configured to provide signals to operate the device 110. The device 110 can be a regulator, such as a voltage regulator, configured to regulate supply provided by the power supply 102 to the ring oscillator 130. The device 110 can be further configured to track attribute variations of the ring oscillator 130, make adjustments to regulate voltage outputted from the ring oscillator 130, and/or perform other operations to regulate voltages output from the ring oscillator 130. The ring oscillator 130 can be a single end ring oscillator, and can include an odd number of inverters 132. In the example shown in FIG. 1, the ring oscillator 130 can include N inverters (or ring oscillator stages, or delay cell inverters) ranging from n=1, ..., n=N. An inverter at n=1 can be a replica 131 that can be biased from unregulated supply $V_{UR}$ being output from the power supply 102. A plurality of inverters 132 from n=2 to n=N can be biased from the same regulated supply from the device 110. Each inverter among the replica 131 and the inverters 132 can include a pair of transistors, such as a P-type field effect transistor (FET) and a N-type FET.

The device 110 can include a voltage regulator (e.g., LDO regulator) and a plurality of circuit components. The device 110 can include a plurality of switches 134, wherein the switches 134 can be controlled by the device 120 to activate or deactivate a number of inverters among the inverters 132. The device 110 can also include a circuit 112 that can receive a reference voltage $V_{REF}$ from a voltage source 106. In an example, the circuit 112 can include an error amplifier and the voltage source 106 can be a scaled version of the bandgap voltage reference circuit. The device 110 can also include a circuit 114 configured to receive one of the outputs, such as one of the multiple phase signals from the ring oscillator 130, and determine a gate delay (denoted as $T_d$) using the received phase signal received from the ring oscillator 130. The circuit 114 can determine the oscillation frequency of the ring oscillator 130 based on $T_d$, and determine an adjustment amount to adjust one or more of body bias voltages $V_p$ and $V_n$ for the inverters 132. In an example, voltage mode bias can be used to adjust the body bias voltages $V_p$ and $V_n$. The device 120 can provide an input 122 to the device 110. The input 122 can include, for example, a number or a particular subset of inverters 132 to be activated among the N inverters 132, an adjustment amount to adjust $V_{REF}$ received by the device 110, a target frequency to be achieved by the ring oscillator 130, and/or other types of data and parameter to implement the device 110 and ring oscillator 130. In some examples, the device 110 can be connected between the replica 131 and an inverter 132 at n=2 (the $2^{nd}$ inverter), such that the replica 131 and the device 110 can operate as a replica circuit of the ring oscillator 130. The input and output of this replica circuit can be shorted together, and a pre-determined current can be provided to the replica 131.

In an example embodiment, the power supply 102 can provide unregulated supply voltage $V_{UR}$ to the ring oscillator 130. The unregulated supply voltage $V_{UR}$ can drop to $V_X$ at a point 105. The device 110 can perform voltage regulation such that the voltage being measured at a point 104 can be regulated voltage $V_R$. The voltage regulation can be based on an operating voltage of a target device couple to the ring oscillator 130, and the regulated voltage $V_R$ can be outputted to the target device. The value of $V_R$ can change proportionally with changes to $V_X$, and $V_X$ can be changed based on, for example, changes in threshold voltages of the transistors among the inverters 132. As $V_R$ varies, a voltage drop between the points 103 and 104 ($V_{UR}-V_R$) also varies. The threshold voltages of the inverters 132 can vary due to process and temperature variations experienced by the transistors within the inverters 132. The threshold voltage changes can also change the gate delay of the transistors among the inverters 132. As the gate delay changes, the oscillation frequency or total delay of the ring oscillator can also change. The device 110 can perform a plurality of regulation or control schemes to compensate the changes in voltages and delay changes caused by the process and temperature variations.

The device 110 can be configured to measure or determine an oscillation frequency $F_{osc}$ of the ring oscillator 130. In an example, the oscillation frequency $F_{osc}$ can be determined using the expression $F_{osc}=1/(2 \times N' \times T_d)$, where N' is the number of activated inverters among the N inverters 132. The device 110 can determine the gate delay $T_d$ by measuring the frequency of the ring oscillator 130 using one or more phase signals outputted from the inverter stages 132.

In an example embodiment, the device 110 can change N', or change the number of inverters for activation, to change the delay or oscillation frequency of the ring oscillator 130. As N' decreases, the oscillator frequency $F_{osc}$ of the ring oscillator increases due to the supply going through less inverter stages (e.g., less delay). In an example, the device 120 can provide a target frequency $F_t$ to the device 110, where $F_t$ can be an operating frequency of a target device receiving $V_R$. The device 110 can compare the oscillation frequency $F_{osc}$ with $F_t$ and determine whether to activate more inverters or less inverters to bring $F_{osc}$ closer to $F_t$. If $F_{osc}$ is less than $F_t$, then the device 110 can operate the switches 134 to deactivate some inverters to increase $F_{osc}$. If $F_{osc}$ is greater than $F_t$, then the device 110 can operate the switches 134 to activate more inverters to decrease $F_{osc}$.

In another example embodiment, the device 110 can adjust the reference voltage $V_{REF}$ received from the voltage source 106 to change or adjust the oscillation frequency of the ring oscillator 130. The reference voltage $V_{REF}$ can be fed to an error amplifier among the circuit 112 to adjust $V_R$. For example, the error amplifier can compare $V_X$ with $V_{REF}$, and if a difference between $V_X$ and $V_{REF}$ exceeds a defined threshold, the circuit 112 can adjust the value of $V_X$ by adjusting body bias voltages of the transistors among inverters 132. If the different between $V_X$ and $V_{REF}$ is less than the defined threshold, no changes may be made to the inverters and the value of $V_R$ can maintain constant. To increase the oscillation frequency $F_{osc}$, the device 110 can increase the value of $V_{REF}$ such that a larger value of $V_X$ may be required to maintain $V_R$ as constant voltage. The increase $V_X$ can lead to less propagation delay, and increased oscillation frequency $F_{osc}$.

In an example embodiment, the device 110 can applied body bias voltages $V_p$ and $V_n$ to transistors among the inverters 132 to adjust the value of $V_X$. Adjustment to the body bias voltage of a transistor can change the threshold voltage of the transistor. Depending on the polarity of the body bias, the threshold voltage can increase or decrease the gate delay of the transistor. For example, a forward body bias can lower the threshold voltage required to turn the transistor on, causing the gate delay of the transistor to decrease. If the transistor is put into a reverse body bias, the threshold voltage can increase and the gate delay of the transistor can increase. The device 110 can compare the oscillation frequency $F_{osc}$ with $F_t$ and determine $V_p$ and $V_n$ that needs to be applied to the body of the transistors among the inverters 132. The device 110 can increase or decrease one or more of the values of $V_p$ and $V_n$, depending on a result of the comparison indicating a need to increase or decrease the oscillation frequency $F_{osc}$.

The adjustment of the number of inverters to activate, the adjustment of the reference voltage $V_{REF}$, and the adjustment of body bias voltages $V_p$ and $V_n$, allow the device 110 to perform different levels of adjustments to the oscillation frequency $F_{osc}$. The regulated voltage $V_R$ can change accordingly with the changes in the oscillation frequency $F_{osc}$ of the ring oscillator 130. In an example, the inverters 132 of the ring oscillator 130 can experience process and/or temperature variations, causing the regulated voltage $V_R$ to change (e.g., increase or decrease) to a new voltage. The oscillation frequency $F_{osc}$ can be used by the device 110 to detect the change in $V_R$. The device 110 can perform one or more of the adjustments to the number activated inverters, the reference voltage $V_{REF}$, and the body bias voltages $V_p$ and $V_n$, to change return the new voltage back to $V_R$. The adjustment of the new voltage to $V_R$ can cause the ring oscillator 130 to operate with a constant supply with the regulated voltage $V_R$. In an example, the adjustment to N' (e.g., the number of inverters to be activated) may be considered as a coarse adjustment due to the change of $F_{osc}$ being proportional to intervals of 1/N'. The adjustment to $V_{REF}$ and $V_p$, $V_n$, can be finer level adjustments when compared to the adjustment of N as $V_{REF}$, $V_p$, and $V_n$ can be adjusted individually and arbitrarily. The adjustment to $V_p$ and $V_n$ can be a finer level adjustment when compared to the adjustment of $V_{REF}$ since the changes to $V_p$ and $V_n$ can be relatively small when compared to the changes in $V_{REF}$. Further, adjustments can be made to either one of $V_p$ and $V_n$ to further refine the adjustments (see FIGS. 4A and 4B). In an example embodiment, the coarse adjustment can be, for example, about 250 milli-volts (mV) while the fine adjustment can be, for example, about 25 mV. The device 110 can be configured to perform one or more of these adjustments to provide a wide range of adjustments to the oscillation frequency $F_{osc}$. This flexibility can allow the output supply voltage to be adjusted in accordance with the target frequency $F_t$.

Figure 2:
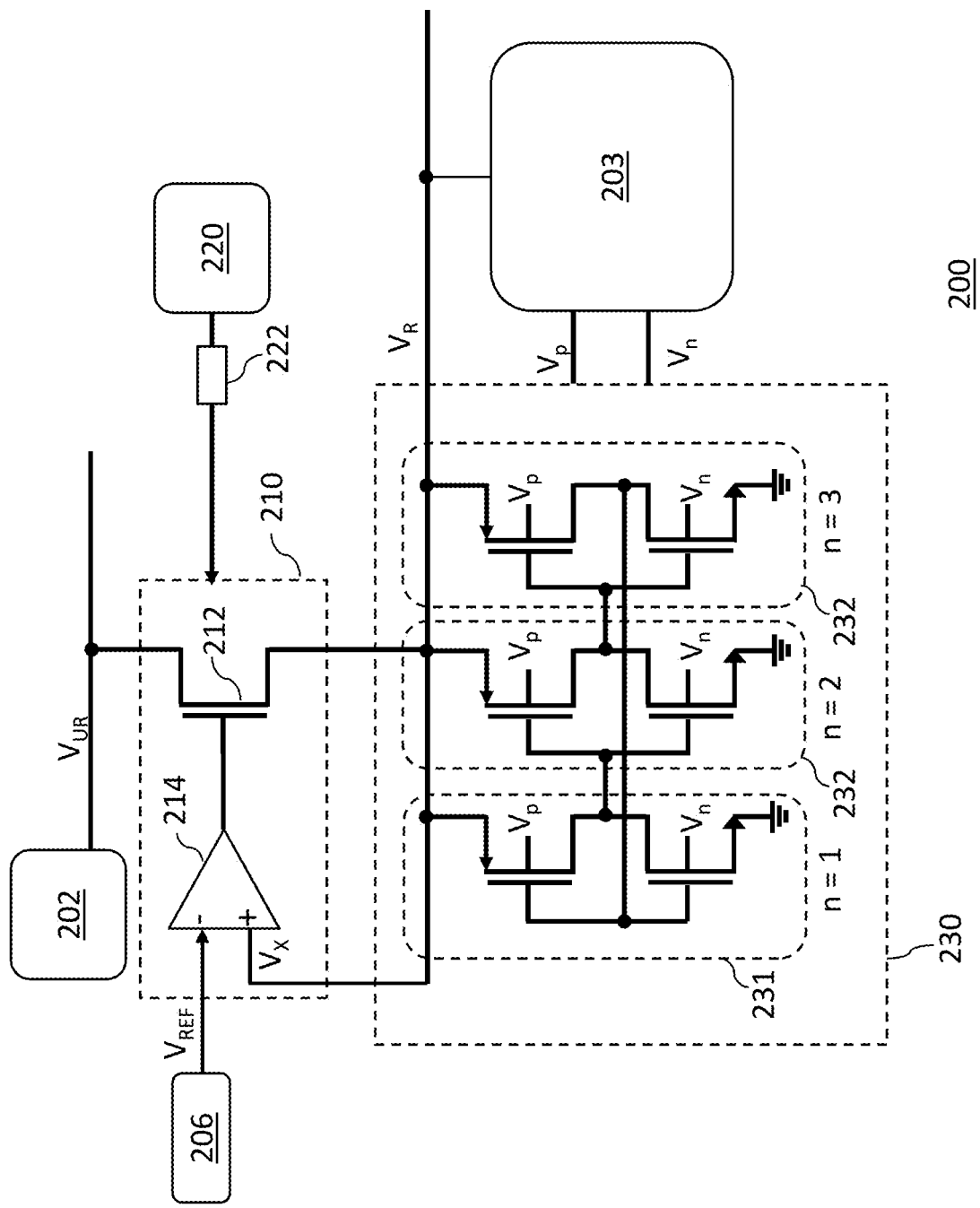
FIG. 2 is a diagram showing another example system that can implement a process and temperature compensated ring oscillator in one embodiment of the present disclosure.

FIG. 2 is a diagram showing another example system 200 that can implement a process and temperature compensated ring oscillator in one embodiment of the present disclosure. The system 200 can include a power supply 202, a device 210, a device 220, a device 203, and/or a ring oscillator 230. The power supply 202 can be configured to provide power to components of the system 100, such as the device 203, the device 210, the device 220, and the ring oscillator 230. The device 203 receiving $V_R$ can be, for example, an integrated circuit, a memory element, or another device that can be operated based on $V_R$. The device 220 can be, for example, a computer, a processor, a controller, and/or other types of hardware device configured to provide signals to operate the device 210. The device 210 can be a regulator, such as a voltage regulator, configured to regulate supply provided by the power supply 202 to the ring oscillator 230. The device 210 can be further configured to track attribute variations of the ring oscillator 230, make adjustments to regulate voltage outputted from the ring oscillator 230, and/or perform other operations to regulate voltages output from the ring oscillator 230. The ring oscillator 230 can be a single end ring oscillator, and can include an odd number of inverters 232. In the example shown in FIG. 2, the ring oscillator 230 can include N inverters (or ring oscillator stages, or delay cell inverters) ranging from n=1, . . . , n=N, where N=3. An inverter at n=1 can be a replica 231 that can be biased from unregulated supply $V_{UR}$ being output from the power supply 202. A plurality of inverters 232 from n=2 to n=N can be biased from the same regulated supply from the device 210. Each inverter among the replica 231 and inverters 232 can include a pair of transistors, such as a P-type field effect transistor (FET) and an N-type FET. In an example embodiment, the ring oscillator can be used in low power systems, such as Internet of Things (IoT) applications, and as a peripheral circuit for clocking applications in memory systems including SRAM, MRAM, ReRAM, PCM.

The device 210 can include a voltage regulator (e.g., LDO regulator) and a plurality of circuit components. The device 210 can include a plurality of switches that can be controlled by the device 220 to activate or deactivate a number of inverters among the N inverters 232. The device 210 can also include a circuit that can receive a reference voltage $V_{REF}$ from a voltage source 206. In an example, the device 210 can include a error amplifier 214 and a transistor 212. In an example embodiment, the transistor 212 can be an N-type FET or a NMOS transistor in the source follower configuration, and the polarity of the error amplifier 214 can be reversed in order to work with the NMOS transistor 212 (see FIG. 3). Note that the NMOS follower configuration may not provide inversion, and the feedback needs to be provided to the inverting terminal (negative sign) of the error amplifier 214. In another example embodiment, the FET 212 can be a N-type FET or PMOS transistor, where the PMOS transistor can provide inversion and the feedback signal can be provided to the non-inverting terminal (positive sign) of the error amplifier 214. In some examples, regardless of whether FET 212 is N-type or P-type FET, negative feedback to the error amplifier 214 can be used to improve operation stability. In another example embodiment, The device 210 can also include a circuit configured to receive a gate delay from the ring oscillator 230, determine an oscillation frequency of the ring oscillator 230 based on the gate delay, and determine an adjustment amount to adjust body bias voltages $V_p$ and $V_n$ for the inverters 232. The device 220 can provide an input 222 to the device 110. The input 222 can include, for example, a number or a particular subset of inverters 232 to be activated among the N inverters 232, an adjustment amount to adjust $V_{REF}$ received by the device 210, a target frequency to be achieved by the ring oscillator 230, and/or other types of data and parameter to implement the device 210 and ring oscillator 230. In some examples, the device 210 can be connected between the replica 231 (n=1) and the inverter 232 (n=2), such that the replica 231 and the device 210 can operate as a replica circuit of the ring oscillator 130. The input and output of this replica circuit can be shorted together, and a pre-determined current can be provided to the replica 231. In an example, a replica circuit can be constructed by using the same unit cell used in the ring oscillator with the input and output connected together.

In an example embodiment, the power supply 202 can provide unregulated supply voltage $V_{UR}$ to the ring oscillator 230. The unregulated supply voltage $V_{UR}$ can drop to $V_X$ due to propagation delay caused by the 1$^{st}$ inverter. The voltage $V_X$ can continue to drop across additional stages of inverters, and the device 210 can perform voltage regulation such that the voltage being measured at the output terminal of the ring oscillator 230 can be regulated voltage $V_R$. The regulated voltage $V_R$ can be outputted to the device 203. The value of $V_R$ can change proportionally with changes to $V_X$, and $V_X$ can be changed based on, for example, changes in threshold voltages of the transistors among the inverters 232. As $V_R$ varies, a voltage drop $V_{UR}$-$V_R$ also varies. The threshold voltages of the inverters 232 can vary due to process and temperature variations experienced by the transistors within the inverters 232. The threshold voltage changes can also change the gate delay of the transistors among the inverters 232. As the gate delay changes, the oscillation frequency or total delay of the ring oscillator can also change. The device 210 can perform a plurality of regulation or control schemes to compensate the changes in voltages and delay changes caused by the process and temperature variations.

The device 210 can be configured to measure or determine an oscillation frequency $F_{osc}$ of the ring oscillator 230. In an example, the oscillation frequency $F_{osc}$ can be determined using the expression $F_{osc}=1/(2\times N'\times T_d)$, where N' is the number of activated inverters among the N inverters 232 and $T_d$ is the gate delay of the first inverter at n=1. The device 210 can determine the gate delay $T_d$ by measuring the frequency of the ring oscillator 230 using phase signals received from of one of the outputs from the inverter stages 232.

In an example embodiment, the device 210 can change N', or change the number of inverters for activation, to change the delay or oscillation frequency of the ring oscillator 130. As N' decreases, the oscillator frequency $F_{osc}$ of the ring oscillator increases due to the supply going through less inverter stages (e.g., less delay). In an example, the device 220 can provide a target frequency $F_t$ to the device 210, where $F_t$ can be an operating frequency of the device 203. The device 210 can compare the oscillation frequency $F_{osc}$ with $F_t$ and determine whether to activate more inverters or less inverters to bring $F_{osc}$ closer to $F_t$.

In an example embodiment, the device 210 can applied body bias voltages $V_p$ and $V_n$ to transistors among the inverters 232 to adjust the value of $V_X$. The device 210 can compare the oscillation frequency $F_{osc}$ with $F_t$ and determine $V_p$ and $V_n$ that needs to be applied to the body of the transistors among the inverters 232. The device can increase or decrease the values of $V_p$ and $V_n$, depending on a result of the comparison indicating a need to increase or decrease the oscillation frequency $F_{osc}$. The adjusted $V_p$ and $V_n$ can also be fed to the device 203 to compensate similar process and temperature variations that may be experienced by components of the device 203. In an example, multiple functional blocks in a system on chip (SoC) environment can use topologies similar to the inverters of a ring oscillator, and providing the same body bias adjustments to all the functional blocks can lead to maximizing power supply rejection ratio (PSRR) from the LDO regulator. The maximization of PSRR can lead to reduced noise coupling among various blocks from the power supply path. An adjustment of body bias voltage can lead to the change in delay for large signal blocks, and a change in transconductance for the small signal blocks, which can be important for amplifiers. Adjustments for body bias can also substitute for the change in power supply voltage (e.g. $V_X$) to result in substantially same circuit performance for process and temperature variations.

In another example embodiment, the device 210 can adjust one or more of i) N' (the number of inverters for activation); ii) body bias voltages $V_p$ and $V_n$ to transistors among the inverters 232; and iii) the reference voltage $V_{REF}$ received from the voltage source 206, to change the delay or oscillation frequency $F_{osc}$ of the ring oscillator 130. In another example embodiment, the device 210 can adjust the reference voltage $V_{REF}$ received from the voltage source 206 to change or adjust the oscillation frequency of the ring oscillator 130. The reference voltage $V_{REF}$ can be fed to the error amplifier 214 among the device 210 to adjust $V_R$. The transistor 212 can operate in strong inversion mode, and the regulated supply $V_R$ can be provided to the ring oscillator 230 and the device 210 can continue to make adjustments (e.g., activate different number of inverters, or adjust $V_p$, $V_n$, $V_{REF}$) until the difference between $V_{REF}$ and $V_X$ is less than the defined threshold, and the target frequency is achieved. Note that in cases where process and temperature variation occurs to the transistors among the inverters 232, the difference between the value of ring oscillator frequency $F_{osc}$, and the target operating frequency $F_t$ can increase, and the values of $V_p$, $V_n$ and $V_{REF}$ can be adjusted in order to bring the error value ($F_t$-$F_{osc}$) substantially close to zero.

In operation, a target $V_{REF}$ for the best power supply rejection ratio (PSRR) in a particular process corner (e.g., nominal corner) can be defined, where this target $V_{REF}$ corresponds to the target frequency $F_t$. A difference between the oscillation frequency $F_{osc}$ and the target frequency $F_t$ can be defined as a frequency error. One or more of the body bias voltages $V_p$ and $V_n$, and the number of inverters for activation N', can be adjusted to minimize this frequency error (e.g., as close to zero as possible). For example, if a difference between this frequency error and zero exceeds a threshold, coarser adjustments can be made by adjusting N'. If the difference between this frequency error and zero is below the threshold, finer adjustments can be made by adjusting $V_p$ and $V_n$. Note that a loop gain of the error amplifier 214 and the transistor 212 combined together in the feedback loop can be substantially greater than 1, causing the reference voltage $V_{REF}$ to be substantially the same as the power supply voltage $V_X$ and the regulated voltage $V_R$. If $V_{REF}$ changes, $V_R$ and $V_X$ can also change accordingly. The implementation of the system 200 to adjust N' and the body bias voltages $V_p$ and $V_n$ can adjust $V_R$ and $V_X$ in cases where the target frequency $F_t$ and/or $V_{REF}$ is changed to provide power supply for different devices (e.g., if device 203 is another device operating in another frequency).

In some examples, ring oscillators can be highly supply sensitive. For example, any noise from the supply can change the oscillation frequency of the ring oscillator. This sensitivity can lead to difficulty in controlling process and temperature variations. The adjustment to supply voltages to compensate process and temperature variations can lead to poor power supply rejection ratio (PSRR) from the regulator. PSRR can be a parameter that describes the capability of an electronic circuit (typically LDO) to suppress power supply variations from the input to its output. PSRR can reflect how much noise from the input of the regulator couples to the output. The PSRR of a regulator in a ring oscillator can determine the amount of ripple remaining at the output supply. In some examples, it may be desirable to increase the PSRR of the regulator to facilitate generation of a "flat", or constant, output supply, or an output with minimal ripple overall process and temperature corners. The systems described herein provides compensation to process and temperature variations without altering or interfering a main signal path of the ring oscillator, keeping $V_{REF}$ substantially constant over process and temperature corners. Further, the systems described herein can provide a low sensitivity compensation or adjustment by using different levels (fine or coarse) levels of adjustments. Furthermore, the compensation or adjustments performed by the systems described herein can implement a voltage regulator with improved PSRR due to the low sensitivity (e.g., less occurrences of adjustments). Using these techniques, the $V_{REF}$ voltage can remain substantially constant over process and temperature corners. For a given unregulated supply, the scheme allows same voltage headroom across the pass transistor 212 ($V_{UR}-V_{REF}$), leading to high gain, and minimum error in the feedback loop formed by the error amplifier 214 and pass transistor 212. High gain in the feedback loop leads to high rejection of the power supply noise.

Figure 3:
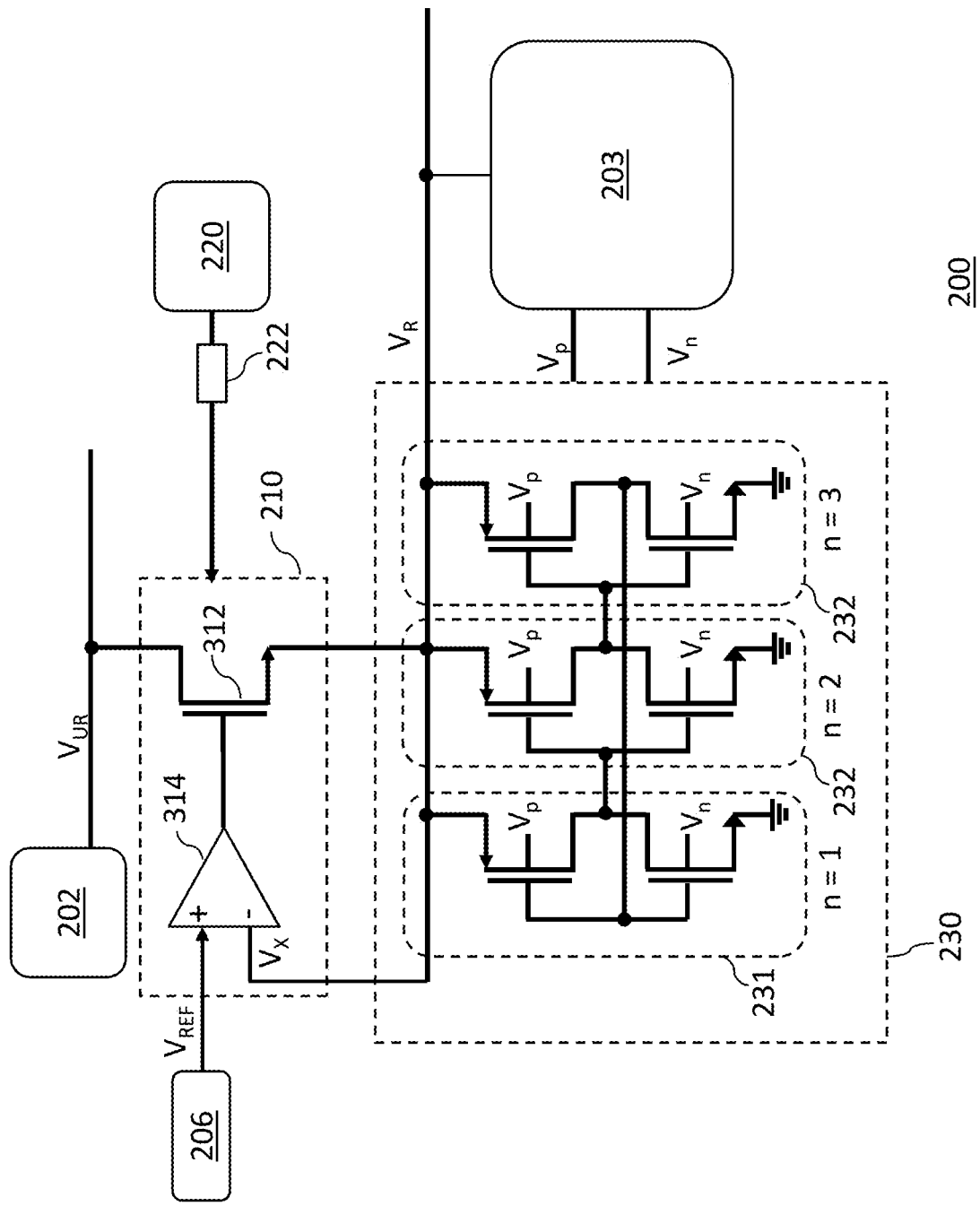
FIG. 3 illustrates an example embodiment of the example system of FIG. 2 that can implement a process and temperature compensated ring oscillator in one embodiment of the present disclosure.

FIG. 3 illustrates an example embodiment of the example system of FIG. 2 that can implement a process and temperature compensated ring oscillator in one embodiment of the present disclosure. The example embodiment of the system 200 shown in FIG. 3 includes a transistor 312 in the source follower configuration, and an error amplifier 314 in a reversed polarity when compared to the error amplifier 214 shown in FIG. 2. The transistor 312 can be a N-type metal-oxide-semiconductor (NMOS) pass transistor. The usage of the a NMOS pass transistor can provide optimal power supply rejection ratio based on superior transconductance when compared to a P-type metal-oxide-semiconductor (PMOS) transistor. Also, the output or dominant pole of the error amplifier 124 can appear at a higher frequency, leading to overall relatively high bandwidth in the regulated power supply $V_R$.

FIGS. 4A and 4B illustrate additional example embodiments of the example system of FIG. 2 that can implement a process and temperature compensated ring oscillator in one embodiment of the present disclosure. FIG. 4A shows the system 200 including a device 410, where the device 410 can be a regulator device configured to regulate supply provided by a power supply (e.g., power supply 102 or 202) to the ring oscillator 230. The device 410 can be implemented similarly to devices 110 and 210 described above. In the example embodiment shown in FIG. 4A, the device 410 can be configured to adjust body bias voltage $V_p$ of the PFETs among the replica 231 and the inverters 232 to adjust the oscillation frequency $F_{osc}$ of the ring oscillator 230. The NFETs among the replica 231 and the inverters 232 can use non-body bias configuration. FIG. 4B shows the system 200 including a device 420, where the device 420 can be a regulator device configured to regulate supply provided by a power supply (e.g., power supply 102 or 202) to the ring oscillator 230. The device 420 can be implemented similarly to devices 110 and 210 described above. In the example embodiment shown in FIG. 4B, the device 420 can be configured to adjust body bias voltage $V_n$ of the NFETs among the replica 231 and the inverters 232 to adjust the oscillation frequency $F_{osc}$ of the ring oscillator 230. The PFETs among the replica 231 and the inverters 232 can use non-body bias configuration.

Figure 5:
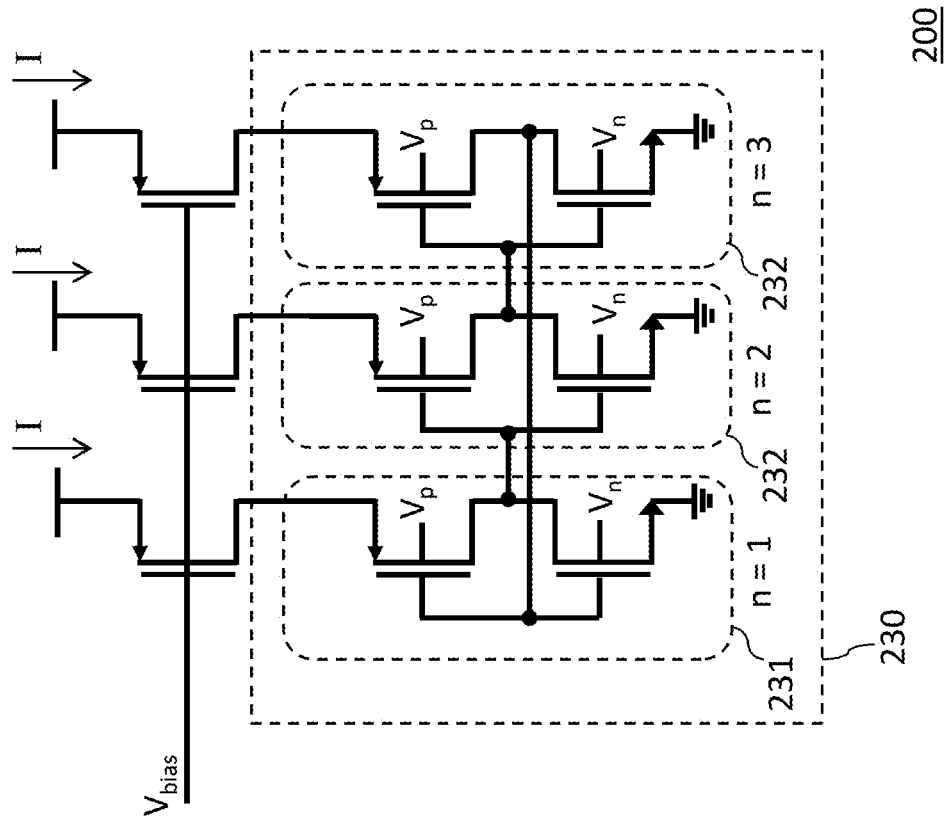
FIG. 5 illustrates another example embodiment of the example system of FIG. 2 that can implement a process and temperature compensated ring oscillator in one embodiment of the present disclosure.

FIG. 5 illustrates another example embodiment of the example system of FIG. 2 that can implement a process and temperature compensated ring oscillator in one embodiment of the present disclosure. In the example embodiment shown in FIG. 5, the body bias voltages $V_p$ and $V_n$ of the replica 231 and inverters 232 can be adjusted using current mode bias. For example, a current I (e.g., from a current generator) can be used to bias each inverter among the replica 231 and the inverters 232 to adjust $V_p$ and $V_n$ of the replica 231 and inverters 232.

Figure 6B:
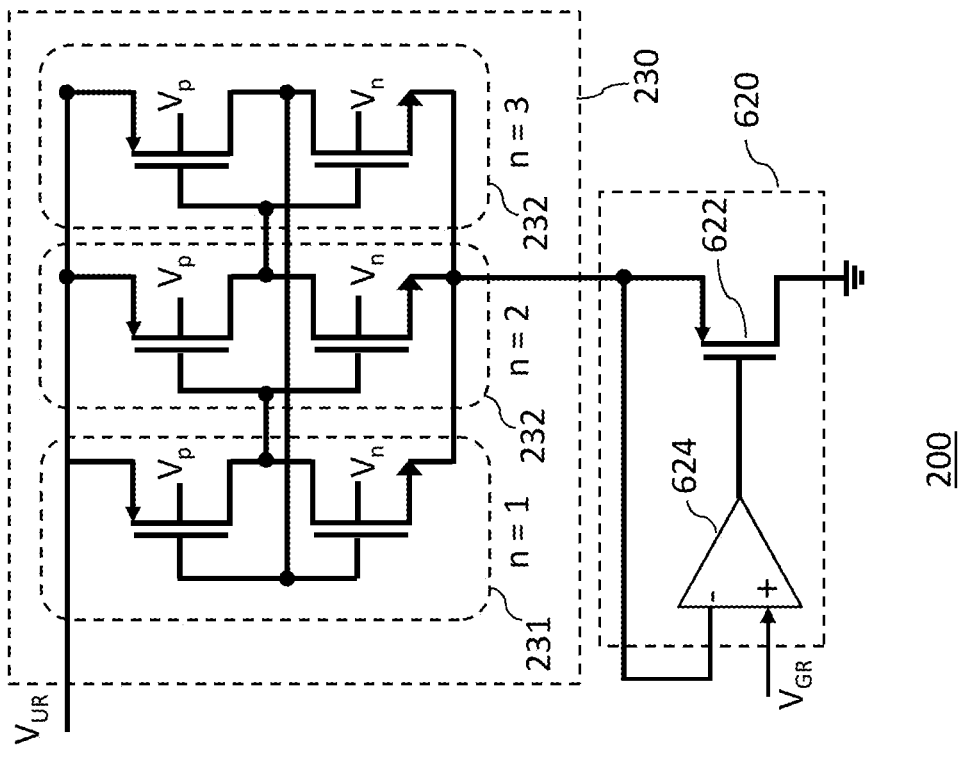
FIG. 6B illustrates another example embodiment of the example system of FIG. 2 that can implement a process and temperature compensated ring oscillator in one embodiment of the present disclosure.
Figure 6A:
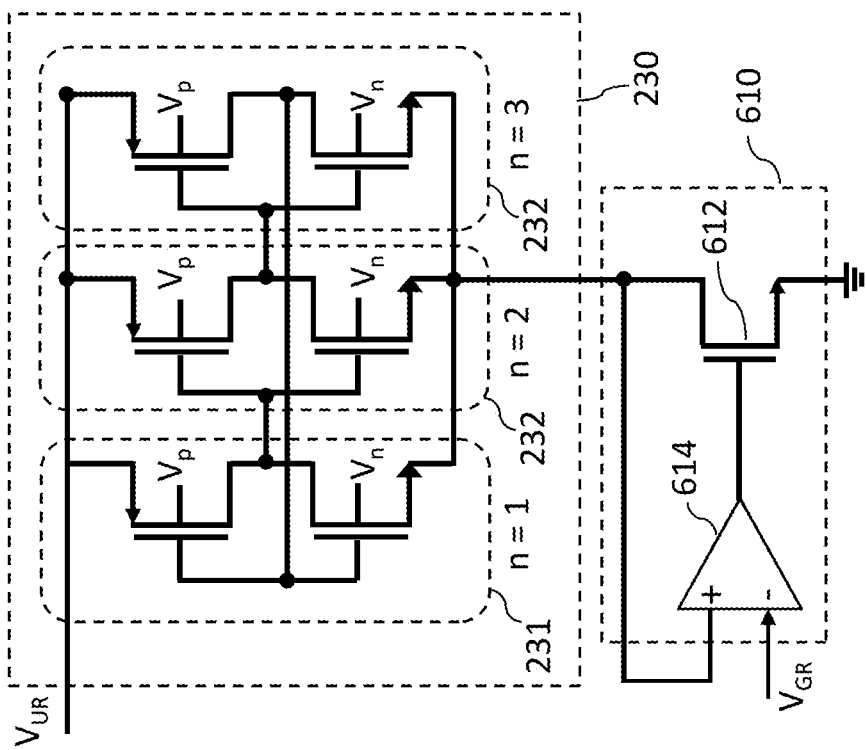
FIG. 6A illustrates another example embodiment of the example system of FIG. 2 that can implement a process and temperature compensated ring oscillator in one embodiment of the present disclosure.

FIGS. 6A and 6B illustrate additional example embodiments of the example system of FIG. 2 that can implement a process and temperature compensated ring oscillator in one embodiment of the present disclosure. FIG. 6A shows the system 200 including a device 610, where the device 410 can be a regulator device configured to regulate supply provided by a power supply (e.g., power supply 102 or 202) to the ring oscillator 230. The device 610 can be implemented similarly to devices 110 and 210 described above. In the example embodiment shown in FIG. 6A, the device 610 can be configured to adjust body bias voltages $V_p$ and $V_n$ of the replica 231 and the inverters 232 to adjust the oscillation frequency $F_{osc}$ of the ring oscillator 230 based on a ground reference voltage $V_{GR}$. For example, the reference voltage VREF described above can be a ground reference voltage $V_{GR}$. The example embodiment shown in FIG. 6A can be implemented using an NMOS pass transistor 612 and an error amplifier 614. In another example embodiment to use the ground reference voltage VGR, the system 200 can be implemented using a PMOS pass transistor 622 with an error amplifier 624, where the polarity of the error amplifier is reversed from the polarity of the error amplifier 614.

Figure 7:
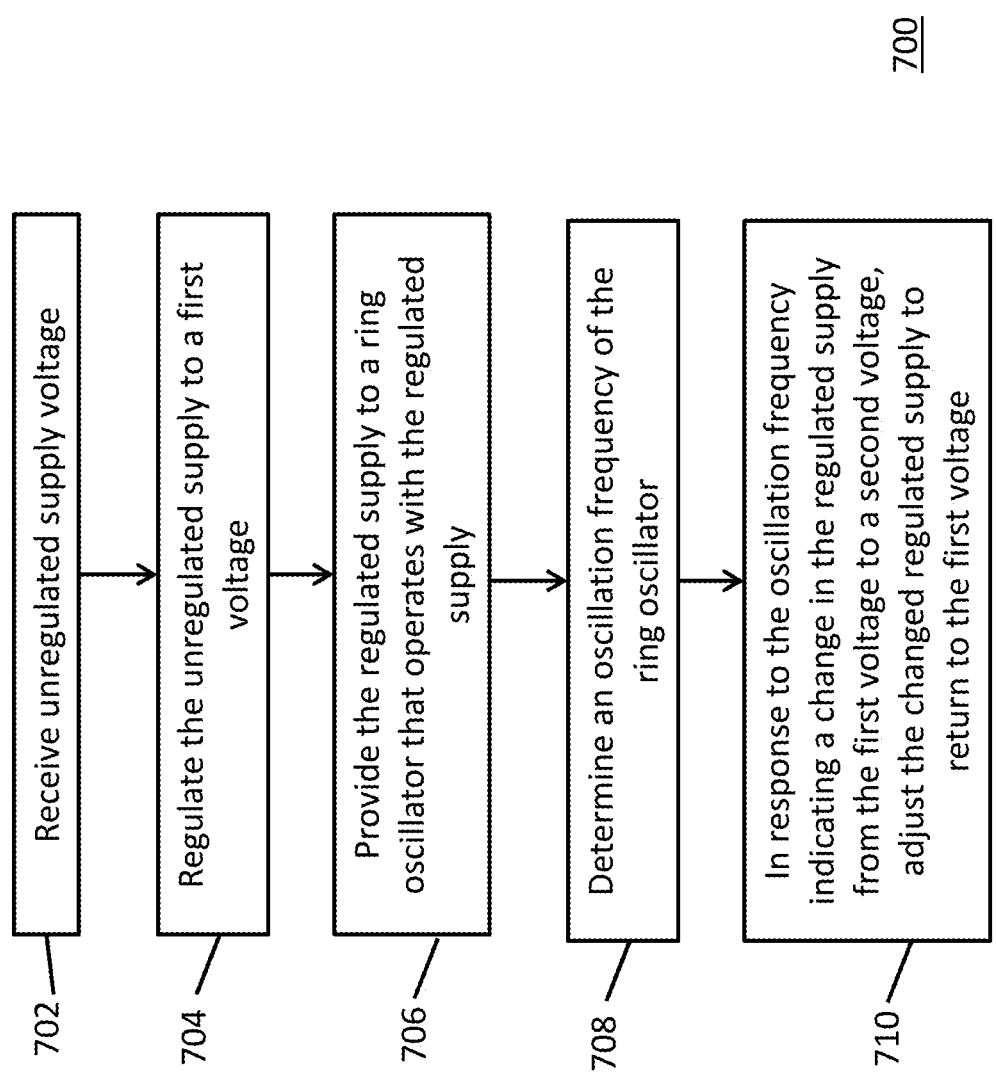
FIG. 7 is a flow diagram illustrating a method of implementing a process and temperature compensated ring oscillator in one embodiment of the present disclosure.

FIG. 7 is a flow diagram illustrating a method of implementing a process 700 and temperature compensated ring oscillator in one embodiment of the present disclosure. An example process may include one or more operations, actions, or functions as illustrated by one or more of blocks 702, 704, 706, 708, and/or 710. Although illustrated as discrete blocks, various blocks can be divided into additional blocks, combined into fewer blocks, eliminated, or performed in parallel, depending on the desired implementation.

The process 700 can begin at block 702, where a device can receive unregulated supply voltage that may be fed to a ring oscillator. The process 700 can continue from block 702 to block 704. At block 704, the device can regulate the unregulated supply to a first voltage. The process 700 can continue from block 704 to block 706. At block 706, the device can provide the regulated supply to the ring oscillator, where the ring oscillator can operate with the regulated supply having the first voltage. The process 700 can continue from block 706 to block 708. At block 708, the device can determine an oscillation frequency of the ring oscillator. The process 700 can continue from block 708 to block 710. At block 710, the device can, in response to the oscillation frequency indicating a change in the regulated supply from the first voltage to a second voltage, adjust the changed regulated supply to return to the first voltage. The adjustment of the changed regulated supply back to the first voltage can cause the ring oscillator to operate with a constant regulated supply having the first voltage. In some examples, the adjustment of the changed regulated supply can include performing one or more of i) adjusting a body bias voltage of a plurality of inverters among the ring oscillator; ii) adjusting a reference voltage received by a regulator coupled to the ring oscillator; and iii) activating a plurality of inverters among the ring oscillator, where a number of activated inverters is based on the oscillation frequency. In some examples, the device can further receive a target oscillation frequency, and compare the target oscillation frequency with the determined oscillation frequency. The adjustment of the changed regulated supply of the ring oscillator can be based on a result of the comparison between the target oscillation frequency with the determined oscillation frequency.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A system comprising:
    a ring oscillator being configured to receive unregulated supply;
    a device connected to the ring oscillator, the device being configured to:
    regulate the unregulated supply to a first voltage;
    provide the regulated supply to the ring oscillator, wherein the ring oscillator operates with the regulated supply; and
    in response to a change in the regulated supply from the first voltage to a second voltage, adjust a voltage level of the changed regulated supply to the first voltage to cause the ring oscillator to operate with a constant regulated supply having the first voltage.

2. The system of claim 1, wherein the device is configured to:
    determine an oscillation frequency of the ring oscillator; and
    based on the oscillation frequency of the ring oscillator, adjust a body bias voltage of a plurality of inverters among the ring oscillator to adjust the changed regulated supply.

3. The system of claim 2, wherein the device is configured to:
    receive a target oscillation frequency;
    compare the target oscillation frequency with the determined oscillation frequency; and
    based on a result of the comparison between the target oscillation frequency with the determined oscillation frequency, adjust the body bias voltage of a plurality of inverters among the ring oscillator to adjust the changed regulated supply.

4. The system of claim 1, wherein the device is configured to adjust a reference voltage received by the device to adjust the changed regulated supply.

5. The system of claim 4, wherein the reference voltage is a bandgap reference voltage.

6. The system of claim 1, wherein the device is configured to activate a number of inverters among the ring oscillator to adjust the changed regulated supply.

7. The system of claim 6, wherein the device is configured to receive a target oscillation frequency, and the number of activated inverters is based on the target oscillation frequency.

8. The system of claim 1, wherein the device is configured to:
receive a target oscillation frequency;
determine an oscillation frequency of the ring oscillator;
compare the target oscillation frequency with the determined oscillation frequency;
based on a result of the comparison between the target oscillation frequency with the determined oscillation frequency, perform one or more of:
adjust a body bias voltage of a plurality of inverters among the ring oscillator to adjust the changed regulated supply;
adjust a reference voltage received by the device to adjust the changed regulated supply; and
activate a plurality of inverters among the ring oscillator to adjust the changed regulated supply.

9. The system of claim 1, wherein the device is configured to:
receive a target operating frequency of an integrated circuit; and
adjust the changed regulated supply of the ring oscillator based on the target operating frequency.

10. A system comprising:
a power supply configured to provide unregulated supply;
a ring oscillator configured to receive the unregulated supply;
an integrated circuit having an operating frequency;
a device connected to the ring oscillator and the integrated circuit, the device being configured to:
receive the unregulated supply;
regulate the unregulated supply to a first voltage;
provide the regulated supply to the ring oscillator, wherein the ring oscillator operates with the regulated supply;
in response to a change in the regulated supply from the first voltage to a second voltage, adjust a voltage level of the changed regulated supply to the first voltage to cause the ring oscillator to operate with a constant regulated supply having the first voltage; and
send the adjusted regulated supply to the integrated circuit.

11. The system of claim 10, wherein the device is configured to:
determine an oscillation frequency of the ring oscillator;
based on the oscillation frequency of the ring oscillator, adjust a body bias voltage of a plurality of inverters among the ring oscillator to adjust the changed regulated supply;
send the adjusted body bias voltage to the integrated circuit.

12. The system of claim 11, wherein the device is configured to:
compare the operating frequency of the integrated circuit with the determined oscillation frequency to detect the change to the regulated supply; and
based on a result of the comparison between the operating frequency of the integrated circuit with the determined oscillation frequency, adjust the body bias voltage of a plurality of inverters among the ring oscillator to adjust the changed regulated supply.

13. The system of claim 10, wherein the device is configured to adjust a reference voltage received by the device to adjust the changed regulated supply.

14. The system of claim 13, wherein the reference voltage is a bandgap reference voltage.

15. The system of claim 10, wherein the device is configured to activate a number of inverters among the ring oscillator to adjust the changed regulated supply.

16. The system of claim 15, wherein the number of activated inverters is based on the operating frequency of the integrated circuit.

17. The system of claim 10, wherein the device is configured to:
determine an oscillation frequency of the ring oscillator;
compare the operating frequency of the integrated circuit with the determined oscillation frequency to detect the change to the regulated supply;
based on a result of the comparison between the operating frequency of the integrated circuit with the determined oscillation frequency, perform one or more of:
adjust a body bias voltage of a plurality of inverters among the ring oscillator to adjust the changed regulated supply;
adjust a reference voltage received by the device to adjust the changed regulated supply; and
activate a plurality of inverters among the ring oscillator to adjust the changed regulated supply.

18. A method for regulating supply voltage, the method comprising:
receiving unregulated supply voltage;
regulating the unregulated supply to a first voltage;
providing the regulated supply to a ring oscillator that operates with the regulated supply;
determining an oscillation frequency of the ring oscillator; and
in response to the oscillation frequency indicating a change in the regulated supply from the first voltage to a second voltage, adjusting a voltage level of the changed regulated supply to the first voltage to cause the ring oscillator to operate with a constant regulated supply having the first voltage.

19. The method of claim 18, wherein adjusting the changed regulated supply comprises one or more of:
adjusting a body bias voltage of a plurality of inverters among the ring oscillator;
adjusting a reference voltage received by a regulator coupled to the ring oscillator; and
activating a plurality of inverters among the ring oscillator, wherein a number of activated inverters is based on the oscillation frequency.

20. The method of claim 18, further comprising:
receiving a target oscillation frequency; and
comparing the target oscillation frequency with the determined oscillation frequency, wherein the adjustment of the changed regulated supply of the ring oscillator is based on a result of the comparison between the target oscillation frequency with the determined oscillation frequency.

* * * * *